(12) United States Patent
Whitney

(10) Patent No.: US 8,076,751 B2
(45) Date of Patent: Dec. 13, 2011

(54) CIRCUIT PROTECTION DEVICE INCLUDING RESISTOR AND FUSE ELEMENT

(75) Inventor: Stephen J. Whitney, Lake Zurich, IL (US)

(73) Assignee: Littelfuse, Inc., Des Plaines, IL (US)

( * ) Notice: Subject to any disclaimer, the term of this patent is extended or adjusted under 35 U.S.C. 154(b) by 147 days.

(21) Appl. No.: 12/106,797

(22) Filed: Apr. 21, 2008

(65) Prior Publication Data
US 2009/0261451 A1 Oct. 22, 2009

(51) Int. Cl.
*H01L 29/72* (2006.01)
(52) U.S. Cl. ........ 257/529; 257/209; 338/22 R; 361/104
(58) Field of Classification Search .................. 257/209, 257/529; 338/22 R; 361/104
See application file for complete search history.

(56) References Cited

U.S. PATENT DOCUMENTS

| | | | | |
|---|---|---|---|---|
| 4,432,722 A | * | 2/1984 | Bohan et al. | 431/46 |
| 5,898,294 A | * | 4/1999 | Gold | 320/139 |
| 2006/0049466 A1 | * | 3/2006 | Egawa et al. | 257/379 |

* cited by examiner

*Primary Examiner* — Edward Wojciechowicz
(74) *Attorney, Agent, or Firm* — Kacvinsky Daisak, PLLC

(57) ABSTRACT

An integral circuit protection device includes a substrate disposed between first and second terminals. The substrate is composed of a resistive material. A first conductive layer is disposed on a first surface of the substrate and in electrical contact with the first terminal. A second conductive layer is disposed on a second surface of the substrate. A first electrically insulating layer is disposed on the second conductive layer and substantially covers the second conductive layer. The first electrically insulating layer includes an aperture. A fuse element is disposed on the first electrically insulating layer and is in electrical contact with the second conductive layer through the aperture and in electrical contact with the second terminal. The fuse element is in electrical series with the resistive material. A second electrically insulating layer is disposed over the fuse element.

13 Claims, 6 Drawing Sheets

CIRCUIT PROTECTION DEVICE INCLUDING RESISTOR AND FUSE ELEMENT

BACKGROUND

The present disclosure relates, generally, to circuit protection devices. More particularly, it relates to circuit protection devices providing both overcurrent protection and a current limitation in a single device.

Many electronic devices, such as battery chargers and the like, require a large initial current when powered up, such as to charge capacitors or for other reasons. It is desirable to limit this initial current to prevent damage to components. It is also desirable to provide a fuse element to provide overcurrent protection in the event of a component failure. In the case of a short circuit, an overcurrent fuse will open if the current exceeds a predetermined value. In many applications, particularly electronic devices, it would be desirable to combine the overcurrent protection and resistor in a single device to minimize the required space.

SUMMARY

In an embodiment, an integral circuit protection device includes a substrate disposed between first and second terminals. The substrate is composed of a resistive material. A first conductive layer is disposed on a first surface of the substrate and in electrical contact with the first terminal. A second conductive layer is disposed on a second surface of the substrate. A first electrically insulating layer is disposed on the second conductive layer and substantially covers the second conductive layer. The first electrically insulating layer includes an aperture. A fuse element is disposed on the first electrically insulating layer and is in electrical contact with the second conductive layer through the aperture and in electrical contact with the second terminal. The fuse element is in electrical series with the resistive material. A second electrically insulating layer is disposed over the fuse element.

In a further embodiment, the resistive material is a negative temperature coefficient material. The circuit protection device may provide an electrical resistance of between 5Ω to 200Ω at a temperature of 25° C. and an electrical resistance of between 50 mΩ to 2Ω at a temperature of 150° C. The circuit protection device may provide a first electrical resistance at a temperature of 25° C. and a second electrical resistance at a temperature of 150° C., wherein the second electrical resistance is between 1% and 10% of the first electrical resistance.

In an embodiment, the NTC material is selected from a metal oxide material.

In an embodiment, the second electrically insulating layer includes an aperture. An electrical connection is provided through the aperture from the fuse to the second terminal. A third electrically insulating layer may be disposed on a portion of the substrate opposite the first insulative layer.

In an embodiment, a method of forming an integral circuit protection device includes providing a substrate composed of a resistive material. A first conductive layer is applied to a first surface of the substrate. A second conductive layer is applied to a second surface of the substrate opposite the first surface. A first electrically insulating layer is applied on the first conductive layer and substantially covers the first conductive layer. The first electrically insulating layer includes an aperture. A fuse element is provided on the first electrically insulating layer and is in electrical contact with the first conductive layer through the aperture. A second electrically insulating layer is disposed over the fuse element. First and second terminals are provided on the ends of the device. The first terminal is in electrical contact with the fuse element and the second terminal is in electrical contact with second conductive layer.

In an embodiment, the method includes forming a third electrically insulating layer over the second conductive layer.

In an embodiment, the method includes providing an aperture in the second electrically insulating layer for electrical connection between the first terminal and the fuse element.

In another embodiment, an integral circuit protection device includes a negative temperature coefficient material disposed adjacent to and in electrical contact with a first terminal. A fuse element is disposed between the resistive material and a second terminal. The fuse element is in electrical series with the resistive material. An electrically insulating material is disposed around the fuse element between the resistive material and the second terminal.

In another embodiment, an integral circuit protection device includes first and second terminals. A resistive material is disposed adjacent to and in electrical contact with the first terminal. A first electrode including a first conductive layer is disposed on a first surface of the resistive material adjacent the first terminal. A second electrode including a second conductive layer is disposed on a second surface of the resistive material opposite the first surface. A fuse element is disposed between the resistive material and the second terminal. The fuse element is in electrical series with the resistive material. An electrically insulating material is disposed around the fuse element between the resistive material and the second terminal.

In a further embodiment, the device includes a first lead in electrical communication with and extending from the first terminal, and a second lead in electrical communication with and extending from the second terminal. The first terminal is disposed at a first end of the device and the second terminal is disposed at a second of the device opposite the first terminal.

In an embodiment, the circuit protection device has a length extending from the first terminal to the second terminal. The fuse element has a length extending at least 50% of the length of the circuit protection device.

In an embodiment, the device is generally cylindrical in shape and the fuse element is generally disposed along an axis of the device between the resistive material and the second terminal.

In another embodiment, an integral circuit protection device includes a generally flat substrate disposed between first and second terminals. The substrate is composed of an electrically insulative material. A resistive material layer is disposed on the substrate and in electrical contact with the first terminal. A fuse element layer is disposed on the substrate between the resistive material layer and the second terminal. The fuse element layer is in electrical series with the resistive material between the first and second terminals.

In another embodiment, an integral circuit protection device includes a fuse element disposed between and in electrical contact with first and second end caps. An insulative housing is disposed around the fuse element and extends between the first and second end caps. A center terminal is disposed on the insulative housing between the first and second end caps. A resistive material layer is disposed on the insulative housing between the first end cap and the center terminal and in electrical contact with the first end cap and the center terminal.

In a further embodiment, an insulative layer is disposed over the resistive material layer. The resistive material layer extends around an exterior surface of the insulative surface to provide a resistive material length greater than a length between the first and cap and the second end cap.

In another embodiment, an integral circuit protection device includes an electrically insulating substrate disposed between first and second terminals. A fuse element is disposed on the substrate and in electrical contact with the first terminal and electrically insulated from the second terminal. A resistive material is disposed over a portion of the fuse element and is electrically insulated from the second terminal. An electrode is disposed on the substrate and in electrical communication with the resistive material and the second terminal but electrically insulated from the first terminal. An electrically insulating layer is disposed over portions of the electrode, the fuse element, and the resistive material.

In an embodiment, the fuse element is provided as a thin layer disposed on a surface of the substrate. The resistive material is provided as a thin layer disposed on a portion of the fuse element and substrate. The electrode is provided as a thin layer disposed on a portion of the resistive material, such that the resistive material is substantially disposed between the electrode and the fuse element.

Additional features and advantages are described herein, and will be apparent from the following Detailed Description and the figures.

BRIEF DESCRIPTION OF THE FIGURES

FIGS. 2 to 6 are top views of successive stages in the production of the circuit protection device of FIG. 1.

FIGS. 2A to 6A are cross-sectional views along lines 2A-2A to 6A-6A of FIGS. 2 to 6, respectively.

FIGS. 2B to 6B are cross-sectional views along lines 2B-2B to 6B-6B of FIGS. 2 to 6, respectively.

DETAILED DESCRIPTION

The present disclosure provides an integral circuit protection device with a resistor and a fuse element in electrical series in a single device. The circuit protection devices disclosed herein provide alternatives to separate fuses and resistors connected in series, and fusible resistors. Integrating the fuse and resistor or thermistor provides a device with a smaller footprint, lower cost, and better coordination than separate components. In power supply and motor applications, the resistor limits the initial inrush currents during start up of the device, and the fuse element provides over current protection in the event of a component failure. In particular, using a negative temperature coefficient (NTC) thermistor initially provides significant electrical resistance to limit inrush current, but after self-heating the resistance drops, allowing normal operation of the load and less waste of electrical energy. Negative temperature coefficient materials have an electrical resistivity that decreases with increasing temperature.

The circuit protection devices disclosed herein provide enhanced performance during overload faults. Existing fusible resistors provide resistive elements comprised of high temperature melting materials such as Cromel, which results in excessive temperature rise on extended overload currents. This necessitates physical isolation of the fusible resistor from the circuit board and adjacent components. By using the devices of the present disclosure, such as a NTC or low temperature coefficient resistive element in series with a standard fuse element, the integrated device performs the inrush current limiting function and opens the circuit before overheating on an overload or short circuit condition.

The devices disclosed herein may be used in a variety of applications, such as charging devices (including cell phone chargers), consumer electronic devices (such as computers, monitors, televisions, and the like), telecommunication equipment, and compact fluorescent lamps.

Figure 1:
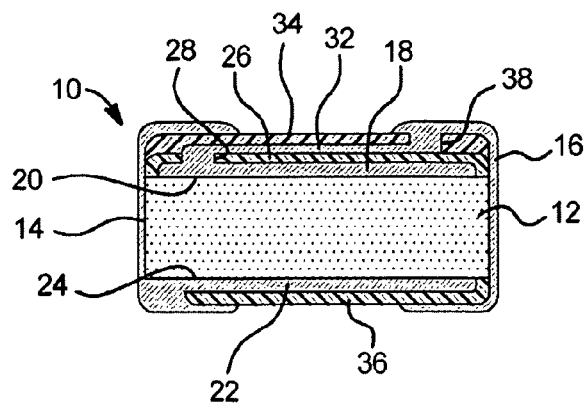
FIG. 1 illustrates a cross-sectional view of an embodiment of a circuit protection device.

FIG. 1 shows a circuit protection device 10. The device 10 includes a substrate 12 and terminals 14, 16 at each end of the substrate. Terminals 14, 16 facilitate connection of the device 10 to a circuit board (such as by surface mounting) or fuse holder in the equipment being protected. The substrate 12 is composed of a resistive material. A conductive layer 18 is disposed on a surface 20 the substrate 12. Conductive layer 18 is preferably not in direct contact with the terminals 14, 16. Another conductive layer 22 may be disposed on the opposing surface 24 of the substrate 12. Conductive layer 22 is preferably in electrical contact with first terminal 14 but not in direct contact with second terminal 16. Conducting layers 18, 22 act as electrodes for substrate 12. Typical overall dimensions of the device 10 may range from 1.6×0.8×0.2 mm to 32×16×5 mm. The insulating and non-insulating layers may range from 5 to 200 microns.

An electrically insulating layer 26 is disposed on the conductive layer 18 and substantially covers the conductive layer 18. The electrically insulating layer 26 includes an aperture 28, to facilitate a conductive path or via. A fuse element 32 is disposed on the electrically insulating layer 26 and is in electrical contact with the conductive layer 18 through the aperture 28. The fuse element 32 may be a thin strip of material and is configured to open the circuit (as by melting) when it reaches a predetermined temperature. The fuse element 32 is in electrical series with the resistive material of the substrate 12. A second electrically insulating layer 34 is disposed over the fuse element 32. An aperture or via 38 may be provided in insulating layer 34 to provide an electrical connection between the fuse element 32 and the terminal 16. A third electrically insulating layer 36 is disposed over conducting layer 22.

The resistive material may be a thermistor material. In particular, the resistive material may be a negative temperature coefficient (NTC) material. Using an NTC material, the electrical resistance of the circuit protection device decreases with increasing temperature. Suitable NTC materials include various combinations of metal oxides such as manganese, nickel, cobalt and copper. The NTC material may provide a resistance of 5 to 200Ω at room temperature, when the device is turned on. During operation, the circuit protection device may heat up to a temperature of about 150° C. and the resistance may decrease by about 1 to 2 orders of magnitude. Thus, in one embodiment, the circuit protection device provides an electrical resistance of between 5Ω to 200Ω at a temperature of 40° C. and an electrical resistance of between 50 mΩ to 2Ω at a temperature of 150° C. The NTC material may have a resistance of 10Ω at startup and a resistance of 150 mg at operating conditions. The circuit protection device can be designed to conduct several amperes indefinitely in normal operation and open to interrupt the circuit in the presence of an abnormal current condition in the range of typically 2 to 1000 times the normal current.

Suitable insulative materials for use in the devices of the present disclosure include ceramic, FR-4 epoxy, glass and melamine. In general, the electrodes can be formed of any conductive metal, e.g., silver, copper, zinc, nickel, gold and alloys thereof, and can be deposited on the substrates via any conventional deposition method, e.g., screen printing, spin coating, vapor deposition, sputtering, plating, etc.

Figures 2, 2A, 2B:
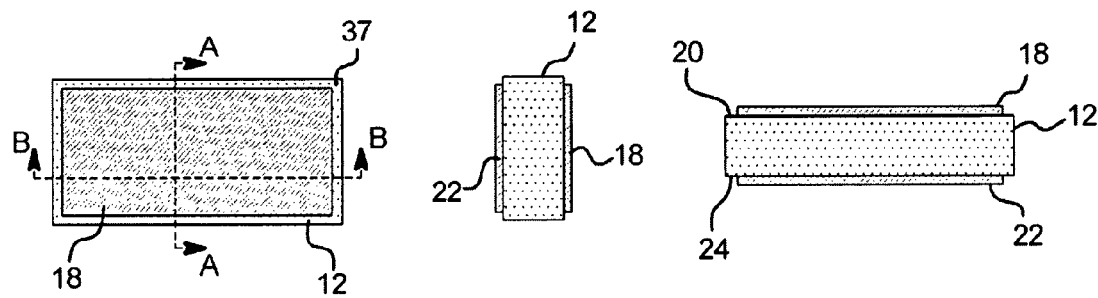
Figures 3, 3A, 3B:
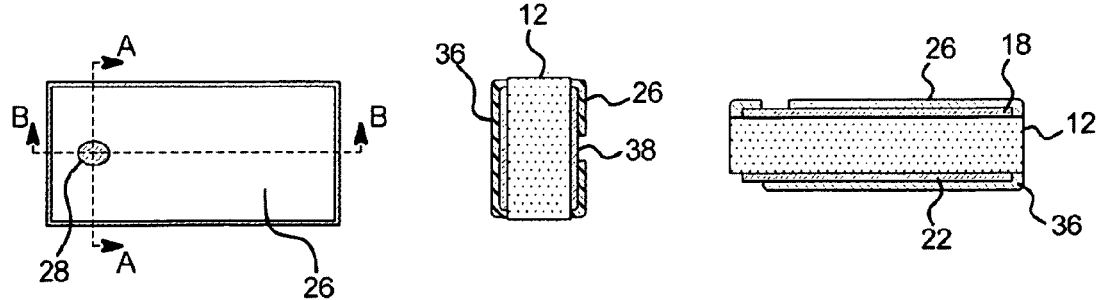

A method of manufacturing the device 10 of FIG. 1 is illustrated in FIGS. 2 to 6. As seen in FIGS. 2, 2A, and 2B, the substrate 12 is provided and coated with top conducting layer 18 and bottom conducting layer 22. Conducting layers 18, 22 preferably cover the top surface 20 and bottom surface 24 except for the periphery 37 of each surface 20, 24. As shown in FIGS. 3, 3A, and 3B, electrically insulating layers 26, 36 are applied over conducting layers 18, 22. An opening 28 is left in the top insulating layer 26 to provide for a connection between the conducting layer 18 and the fuse element 32.

Figure 4:
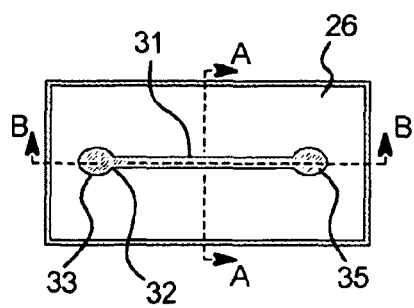
Figure 4A:
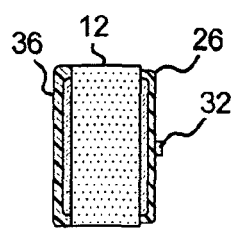
Figure 4B:
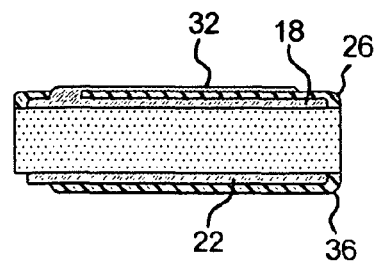
Figure 5:
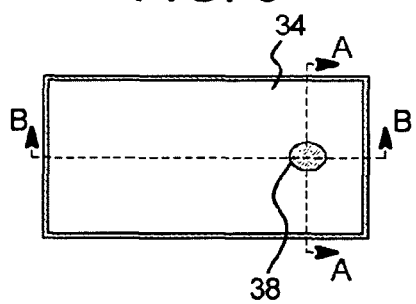
Figure 5A:
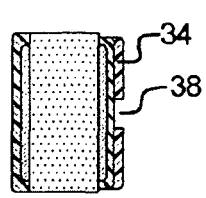
Figure 5B:
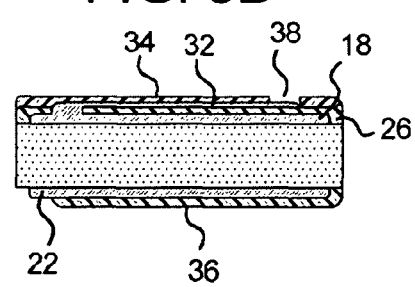
Figure 6:
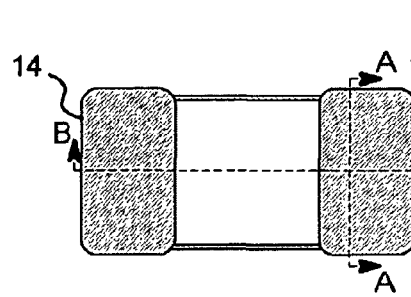
Figure 6A:
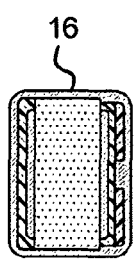
Figure 6B:
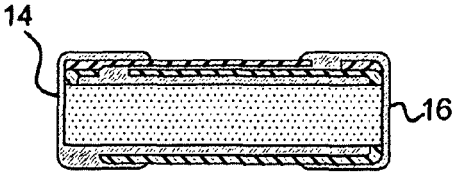

Next, as illustrated in FIGS. 4, 4A, and 4B, fuse element 32 is applied to the surface of insulating layer 26. Fuse element may include extending portion 31 and end portions 33, 35. As illustrated in FIGS. 5, 5A, and 5B, insulating layer 34 is applied over fuse element 32, while leaving an aperture 38 over end portion 35. Finally, as illustrated in FIGS. 6, 6A, and 6B, end caps or terminals 14, 16 are applied to the ends of the device 10 and aperture 38 is filled with a conductive material to electrically connect the fuse element 32 to end cap 16. In one embodiment, the layers are applied in printing and firing operations. Multiple devices (such as several hundred) may be made in a single sheet of material. The individual pieces are cut out of the sheet and end terminations applied to the individual components.

Figure 7:
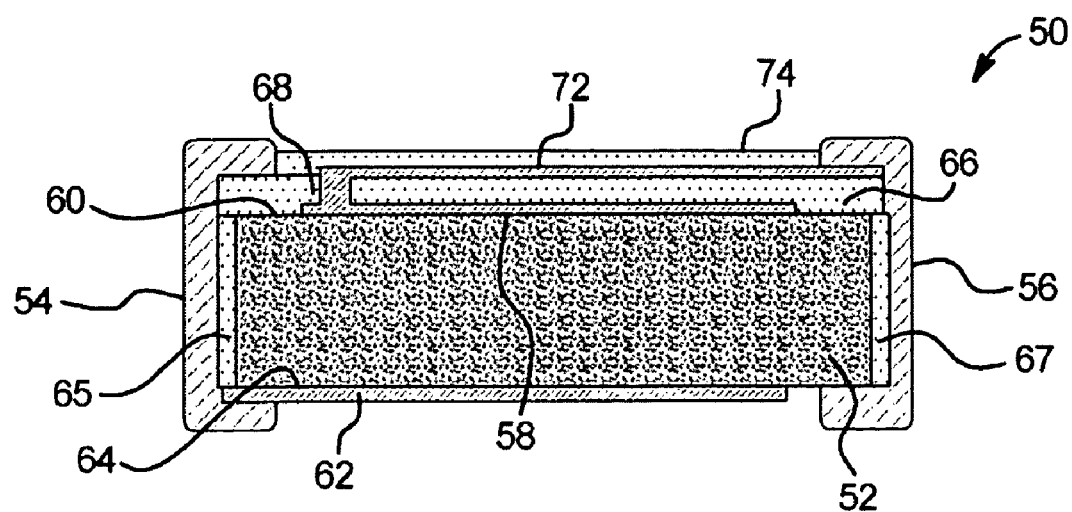
FIG. 7 is sectional view of another embodiment of a circuit protection device.

Various additional embodiments of circuit protection devices will now be disclosed. FIG. 7 shows another embodiment of a circuit protection device 50. The device 50 includes a substrate 52 and terminals 54, 56 at each end of the substrate 52. The substrate 52 is composed of a resistive material. A conductive layer 58 is disposed on a portion of the surface 60 of the substrate 52. Conductive layer 58 is not in direct contact with the terminals 54, 56. Another conductive layer 62 is disposed on the opposing surface 64 of the substrate 52. Conductive layer 62 is in electrical contact with first terminal 54 but not in direct contact with second terminal 56. Conducting layers 58, 62 serve as electrodes for substrate 52. An electrically insulating layer 66 is disposed on the conductive layer 58 and substantially covers the surface of conductive layer 58. The electrically insulating layer 66 includes an aperture 68, to facilitate a conductive path or via. Electrically insulating layers 65, 67 may be applied between the substrate 52 and the terminals 54, 56.

A fuse element 72 is disposed on the electrically insulating layer 66 and is in electrical contact with the conductive layer 58 through the aperture 68. The fuse element 72 may be a thin strip of material and is configured to open the circuit (as by melting) when it reaches a predetermined temperature. The fuse element 72 is in electrical contact with terminal 56 and is configured in electrical series with the resistive material of the substrate 52. A second electrically insulating layer 74 is disposed over the fuse element 32 between the terminals 54, 56. The device may include an additional insulating layer (not shown) over conductive layer 62.

Figure 8:
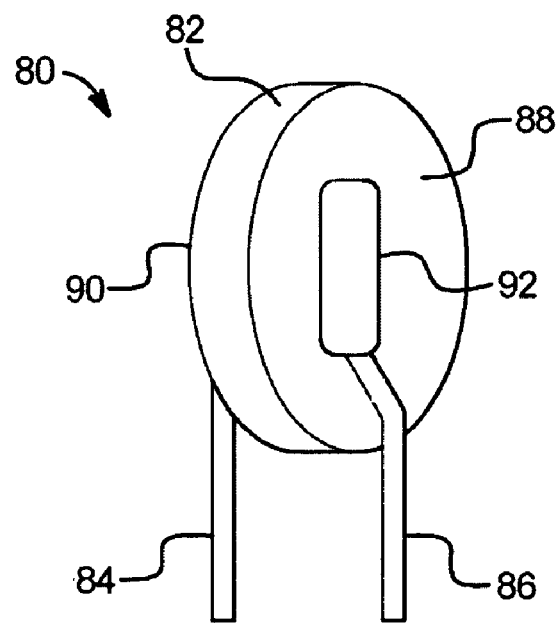
FIG. 8 is a perspective view of another embodiment of a circuit protection device.

FIG. 8 illustrates another embodiment of a circuit protection device 80. The device 80 is configured as a radial lead device. The device 80 includes a substrate 82 with a circular cross section and leads 84, 86 connected to opposite surfaces of the substrate 82. The substrate 82 is composed of a resistive material. A conductive layer or metallized portion 88 is provided on the surface of the substrate 82. Conductive layer 88 is not in direct contact with the terminals 84, 86. Another conductive layer 90 is disposed on the opposing surface of the substrate 82. Conductive layer 90 is in electrical contact with first terminal 84 but not in direct contact with second terminal 86. Conducting layers 88, 90 serve as electrodes for substrate 82. A fuse element 92 is disposed on the conducting layer 88. The fuse element 92 is in electrical contact with terminal 86 and is configured in electrical series with the resistive material of the substrate 82. The entire outer surface of the device 80, except for the ends of the leads 84, 86, may be coated with an electrically insulating layer (not shown). Fuse element 92 may be comprised of insulating and non-insulating layers as described above to form a fuse element in series with the resistive device. Alternatively, fuse element 90 may be discrete fuse assembly, for example a Littelfuse Pico Fuse, or components thereof, physically and electrically attached to conducting layer 88 by means of solder, welding, or other suitable method. Alternatively, fuse element 90 may be a thermally sensitive element, such as that described in U.S. Pat. No. 6,636,403, which is physically and electrically attached to conducting layer 88.

Figure 9:
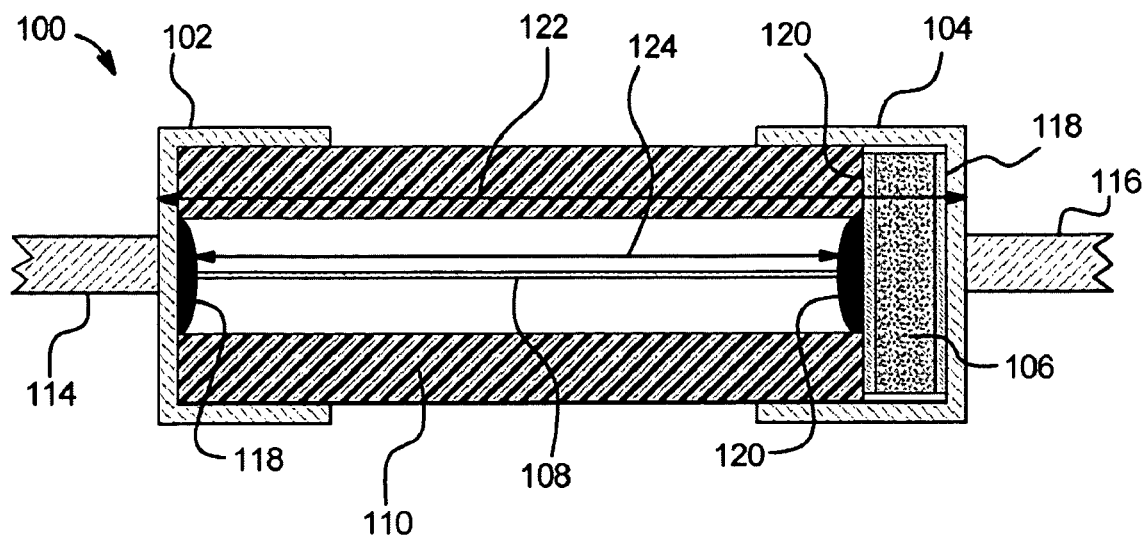
FIG. 9 is a sectional view of another embodiment of a circuit protection device.

Another embodiment of a circuit protection device is shown in FIG. 9. The device 100 may be provided in a generally cylindrical configuration with terminals 102, 104. Terminals or end caps 102, 104, which facilitate connection of the circuit protection device to a printed circuit board in the equipment being protected, are located on each end of the device 100. A resistive material 106 is disposed adjacent to and in electrical contact with terminal 104. A fuse element 108 is disposed between the resistive material 106 and the terminal 104. The fuse element 108 is in electrical series with the resistive material 106. An electrically insulating material 110 is disposed around the fuse element 108. The resistive material 106 includes end surfaces coated with metal layers or electrodes 118, 120. Electrode 118 is in electrical communication with terminal 104, and the two may be bonded together with solder or metallizations. The electrically insulating material 110 may be in the shape of a hollow cylinder disposed a fixed distance around the fuse element 108. The device 100 may further include leads 114, 116 in electrical communication with and extending from the terminals 102, 104 respectively. Solder or metallizations 118, 120 may be applied to electrically and mechanically connect the ends of the fuse element 108 to the terminal 102 and resistive material 106.

The circuit protection device 100 has a length 122 extending from terminal 102 to terminal 104. The fuse element 108 preferably has a length 124 that extends at least 50% of the length 122 of the circuit protection device 100. In an embodiment, the integral circuit protection device 100 is generally cylindrical in shape and the fuse element 108 is generally disposed along an axis of the integral circuit protection device 100 between the resistive material 106 and the terminal 102.

Figure 10:
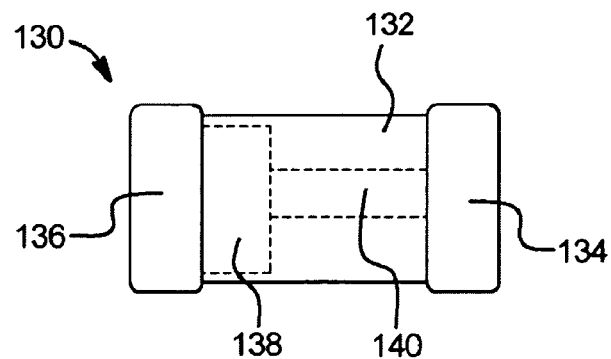
FIG. 10 is a top view of another embodiment of a circuit protection device.

As illustrated in FIG. 10, another embodiment of a circuit protection device 130 includes a generally flat substrate 132 disposed between terminals 134, 136. The substrate 132 comprises an electrically insulative material. A resistive material layer 138 is disposed on the substrate 132 and in electrical contact with the terminal 136. A fuse element layer 140 is disposed on the substrate 132 between the resistive material layer 138 and the terminal 134. The fuse element layer 140 is in electrical series with the resistive material 138 between the terminals 134, 136. Resistive material layer 138 could be any material suitable for use as a resistive element such as a carbon or metal film. To increase the resistivity of the materials, they may contain oxides or insulative materials such as glass or ceramic. Alternatively, resistive material layer 138 could be a material exhibiting NTC properties such as those comprised if various combinations metal oxides, for example manganese, nickel, cobalt and copper.

Although FIG. 10 illustrates the fuse element 140 and terminals 134, 136 disposed on a single side of the substrate 132, other embodiments can include fuse elements on both sides the substrate 132 and also terminals disposed on either side of the substrate 132 and on any portion thereof, not just adjacent to an edge.

Figure 11:
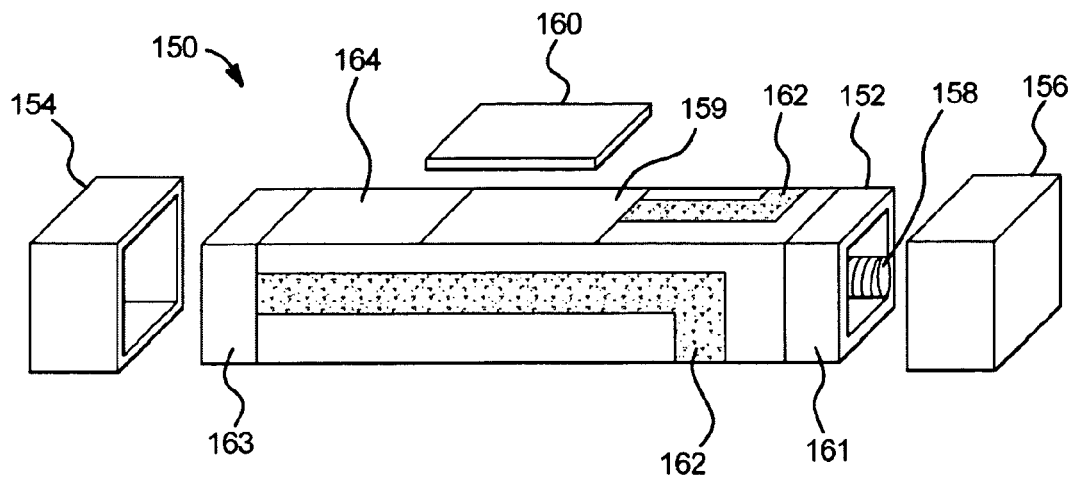
FIG. 11 is a partially exploded isometric view of another embodiment of a circuit protection device.

Another embodiment of a circuit protection device 150 is illustrated in FIG. 11. Circuit protection device 150 is especially suited for telecommunication applications. A fuse element 158 is disposed between and in electrical contact with the end caps 154, 156. The fuse element 158 may be composed of a wire wrapped around an insulator, such as a tin-plated copper wire wrapped around ceramic yarn. An insulative housing 152 is disposed around the fuse element 158 and extends between the end caps 154, 156. Insulative housing 152 may be a hollow structure. Insulative housing 152 includes a conductive pad 159 disposed near a center portion of the housing 152 and conductive end terminations 161, 163 disposed at the ends of the housing. The end caps 154, 156 are configured to be placed on the end portions of housing 152 (in contact with the conductive end terminations 161, 163) and attached thereto. Although housing 152 and end caps 154, 156 are shown as square in cross-section, other shapes (such as round, triangular, and so forth) are possible. A center terminal 160 is disposed on a portion of the insulative housing 152 over the conductive pad 159, between the end caps 154, 156.

A resistive material layer 162 is disposed on the insulative housing 152 between and in electrical contact with the end cap 154 and the center terminal 160. The shape and configuration of resistive material layer 162 may be controlled to provide a desired resistance in the device 170. The resistive material may be applied by any suitable method, such as by printing. As shown in FIG. 11, the layer 162 extends around the exterior of housing 152 between conductive pad 159 (and center terminal 160) and end termination 163 (and end cap 154). In particular, the length or path of the resistive material layer 162 between center terminal 160 and end cap 154 may be longer than the length of the insulative housing 152. An insulative layer 164 may be disposed over the outer surface of the device 150, including over resistive material layer 162, but not over conductive pad 159 and end terminations 161, 163.

Figure 12:
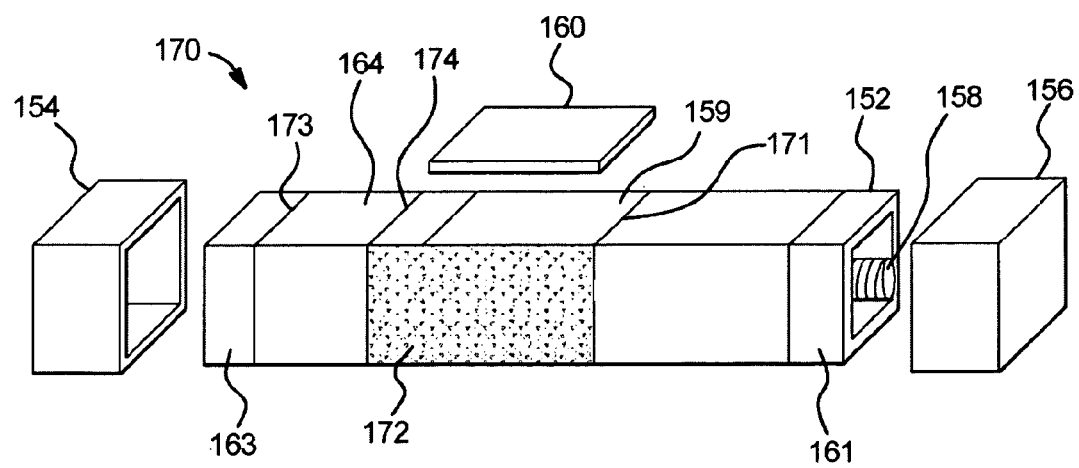
FIG. 12 is a partially exploded isometric view of another embodiment of a circuit protection device.

FIG. 12 shows another embodiment of a device 170 that is in many respects similar to device 150 of FIG. 11. Device 170 includes a resistive layer 172 that is applied only on one end of the device between line 171 adjacent the far end of center terminal 160 and lines 173 adjacent end cap 153. Resistive layer 172 may be applied by, for example, dip-coating the housing 152 into the desire resistive material to apply a layer. The resistive material layer 162 is disposed on the insulative housing 152 between and in electrical contact with the end cap 154 and the center terminal 160. Laser trim lines 174 may be used to remove a portion of the resistive layer 172 to control the configuration and resistance properties of the resistive later 172. An insulative layer 164 may be disposed over the outer surface of the device 150, including over resistive material layer 162.

Figure 13:
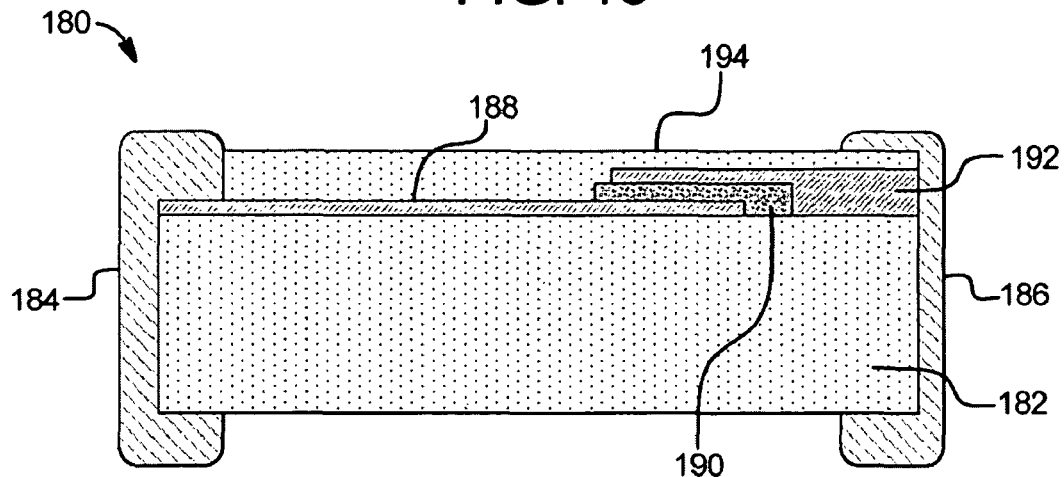
FIG. 13 is a sectional view of another embodiment of a circuit protection device.

FIG. 13 illustrates another embodiment of a circuit protection device 180. The device includes an electrically insulating substrate 182 disposed between the terminals 184, 186. A fuse element 188 is disposed on the substrate 182 and in electrical contact with terminal 184 and electrically insulated from terminal 186. An electrode 192 is disposed on the substrate 182 and in electrical communication with terminal 186 but electrically insulated from terminal 184. A resistive material 190 is disposed between and in electrical contact with the fuse element 188 and the electrode 192. An electrically insulating layer 194 is disposed over portions of the electrode 192, the fuse element 188, and the resistive material 190.

The fuse element 188 may be provided as a thin layer disposed on a surface of the substrate 182. The resistive material 190 may be provided as a thin layer disposed on a portion of the fuse element 188 and substrate 190. The configuration (such as thickness and length) of the resistive material 190 may be adjusted to control the resistive properties of the device. The electrode 192 may be provided as a thin layer disposed on a portion of the resistive material 190, such that the resistive material 190 is substantially disposed between the electrode 192 and the fuse element 188. Typical overall dimensions of the device range from 1.6×0.8×0.2 mm to 32×16×5 mm. The insulating and non-insulating layers may range from 5 to 200 microns in thickness.

Figure 14:
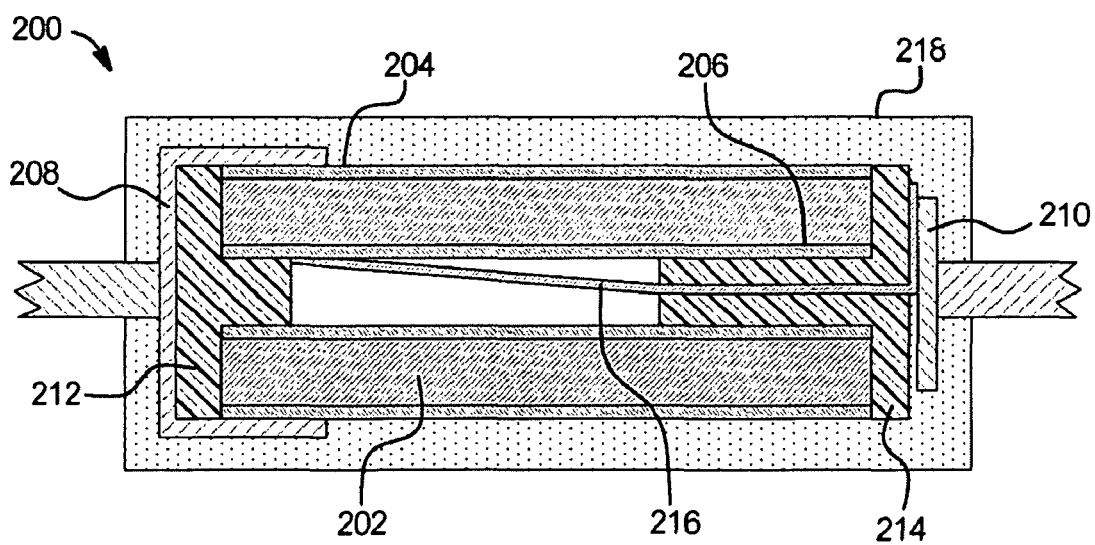
FIG. 14 is a sectional view of another embodiment of a circuit protection device.

Another embodiment of a circuit protection device 200 is illustrated in FIG. 14. Device 200 includes a tube or hollow cylinder 202 made from a resistive material. Disposed on the outer surface of tube 202 is an outer electrode 204 and disposed on the inner surface is an inner electrode 206. Electrodes 204, 206 may be any suitable conductive material. Terminals 208, 210 are disposed at opposite ends of the device 200. End plugs 212, 214 connect terminals 208, 210 to tube 202. End plugs 212, 214 are preferably composed of an insulative material. A fuse element 216 is disposed between and in electrical contact with the inner electrode 206 and terminal 210. Fuse element 216 is disposed through end plug 214. An insulative coating 218 may be disposed over the components to provide an insulated outer surface.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. An integral circuit protection device comprising:
   a first terminal;
   a second terminal;
   a substrate disposed between the first and second terminals, the substrate comprising a resistive material;
   a first conductive layer disposed on a first surface of the substrate and in electrical contact with the first terminal;
   a second conductive layer disposed on a second surface of the substrate;
   a first electrically insulating layer disposed on the second conductive layer and substantially covering the second conductive layer, the first electrically insulating layer comprising an aperture;
   a fuse element disposed on the first electrically insulating layer and in electrical contact with the second conductive layer through the aperture and in electrical contact with the second terminal, wherein the fuse element is in electrical series with the resistive material; and a second electrically insulating layer disposed over the fuse element.

2. The device of claim 1 wherein the resistive material is a negative temperature coefficient material.

3. The device of claim 2 wherein the circuit protection device provides an electrical resistance of between 5Ω to 200Ω at a temperature of 25° C. and an electrical resistance of between 50 mΩ to 2Ω at a temperature of 150° C.

4. The device of claim 2 wherein the circuit protection device provides a first electrical resistance at a temperature of 25° C. and a second electrical resistance at a temperature of 150° C., wherein the second electrical resistance is between 1% and 10% of the first electrical resistance.

5. The device of claim 1 wherein the NTC material is selected from a metal oxide material.

6. The device of claim 1 wherein the second electrically insulating layer comprises an aperture, further comprising an electrical connection through the aperture from the fuse to the second terminal.

7. The device of claim 1 further comprising a third electrically insulating layer disposed on a portion of the substrate opposite the first insulative layer.

8. The integral circuit protection device of claim 1 wherein the fuse element comprises a thermally sensitive element.

9. The integral circuit protection device of claim 1 further comprising a first lead in electrical communication with and extending from the first terminal, and a second lead in electrical communication with and extending from the second terminal.

10. The integral circuit protection device of claim 1 wherein the first terminal is disposed at a first end of the integral circuit protection device and the second terminal is disposed at a second of the integral circuit protection device opposite the first terminal.

11. The integral circuit protection device of claim 1 wherein the integral circuit protection device has a length extending from the first terminal to the second terminal, wherein the fuse element has a length extending at least 50% of the length of the integral circuit protection device.

12. The integral circuit protection device of claim 1 wherein the integral circuit protection device is generally cylindrical in shape and the fuse element is generally disposed along an axis of the integral circuit protection device between the resistive material and the second terminal.

13. The integral circuit protection device of claim 1 wherein the first and second terminals are provided as cylindrical end caps.

* * * * *